(12) United States Patent
Ting et al.

(10) Patent No.: US 7,423,453 B1
(45) Date of Patent: Sep. 9, 2008

(54) EFFICIENT INTEGRATED CIRCUIT LAYOUT SCHEME TO IMPLEMENT A SCALABLE SWITCHING NETWORK USED IN INTERCONNECTION FABRIC

(75) Inventors: Benjamin S. Ting, Saratoga, CA (US); Peter M. Pani, Mountain View, CA (US)

(73) Assignee: Advantage Logic, Inc., Mountain View, CA (US)

( * ) Notice: Subject to any disclaimer, the term of this patent is extended or adjusted under 35 U.S.C. 154(b) by 409 days.

(21) Appl. No.: 11/336,014

(22) Filed: Jan. 20, 2006

(51) Int. Cl.
*H03K 19/177* (2006.01)
(52) U.S. Cl. .......................... 326/41; 326/47; 326/101
(58) Field of Classification Search .................. 326/41, 326/47, 101
See application file for complete search history.

(56) References Cited

U.S. PATENT DOCUMENTS

| | | | |
|---|---|---|---|
| 4,020,469 A | 4/1977 | Manning |
| 4,661,901 A | 4/1987 | Veneski |
| 4,700,187 A | 10/1987 | Furtek |
| 4,720,780 A | 1/1988 | Dolecek |
| 4,736,333 A | 4/1988 | Mead et al. |
| 4,758,745 A | 7/1988 | Elgamal |
| 4,815,003 A | 3/1989 | Putatunda et al. |
| 4,847,612 A | 7/1989 | Kaplinsky |
| 4,870,302 A | 9/1989 | Freeman |
| 4,912,342 A | 3/1990 | Wong et al. |
| 4,918,440 A | 4/1990 | Furtek |
| 4,935,734 A | 6/1990 | Austin |
| 4,992,680 A | 2/1991 | Benedetti et al. |
| 5,122,685 A | 6/1992 | Chan |
| 5,144,166 A | 9/1992 | Camarota et al. |
| 5,187,393 A | 2/1993 | Elgamal et al. |
| 5,204,556 A | 4/1993 | Shankar |
| 5,208,491 A | 5/1993 | Ebeling et al. |
| 5,221,865 A | 6/1993 | Phillips et al. |
| RE34,363 E | 8/1993 | Freeman |
| 5,243,238 A | 9/1993 | Kean |
| 5,256,918 A | 10/1993 | Suzuki |
| 5,260,610 A | 11/1993 | Pederson et al. |
| 5,260,611 A | 11/1993 | Cliff et al. |
| 5,296,759 A | 3/1994 | Sutherland et al. |
| 5,298,805 A | 3/1994 | Garverick et al. |

(Continued)

FOREIGN PATENT DOCUMENTS

EP 0415542 3/1991

(Continued)

OTHER PUBLICATIONS

Altera Corporation Date Sheet, Flex EPF81188 12,000 Gate Programmable Logic Device, Sep. 1992, Ver. 1, pp. 1-20.

(Continued)

*Primary Examiner*—Rexford Barnie
*Assistant Examiner*—Jason M Crawford
(74) *Attorney, Agent, or Firm*—Blakely, Sokoloff, Taylor & Zafman LLP

(57) ABSTRACT

Efficient layout schemes to implement switching networks of an interconnection fabric in an integrated circuit to connect two sets of conductors through rows of switches with prescribed number of tracks over the switching area are described. The layout schemes can be used repeatedly for multiple-stage switching network and/or hierarchically arranged switching networks.

15 Claims, 7 Drawing Sheets

U.S. PATENT DOCUMENTS

| | | | |
|---|---|---|---|
| 5,329,470 | A | 7/1994 | Sample et al. |
| 5,349,691 | A | 9/1994 | Harrison et al. |
| 5,369,314 | A | 11/1994 | Patel et al. |
| 5,376,844 | A | 12/1994 | Pederson et al. |
| 5,396,126 | A | 3/1995 | Britton et al. |
| 5,406,525 | A | 4/1995 | Nicholes |
| 5,444,394 | A | 8/1995 | Watson et al. |
| 5,455,525 | A | 10/1995 | Ho et al. |
| 5,457,410 | A | 10/1995 | Ting |
| 5,469,003 | A | 11/1995 | Kean |
| 5,477,067 | A | 12/1995 | Isomura et al. |
| 5,485,103 | A | 1/1996 | Pederson et al. |
| 5,519,629 | A | 5/1996 | Snider |
| 5,537,057 | A | 7/1996 | Leong et al. |
| 5,550,782 | A | 8/1996 | Cliff et al. |
| 5,552,722 | A | 9/1996 | Kean |
| 5,572,148 | A | 11/1996 | Lytle et al. |
| 5,581,199 | A | 12/1996 | Pierce et al. |
| 5,581,767 | A | 12/1996 | Katsuki et al. |
| 5,815,004 | A | 9/1998 | Trimberger et al. |
| 5,825,202 | A | 10/1998 | Tavana |
| 5,835,405 | A | 11/1998 | Tsui et al. |
| 5,850,564 | A | 12/1998 | Ting et al. |
| 5,880,597 | A | 3/1999 | Lee |
| 5,883,526 | A | 3/1999 | Reddy et al. |
| 5,894,228 | A | 4/1999 | Reddy |
| 5,903,165 | A | 5/1999 | Jones et al. |
| 5,914,616 | A | 6/1999 | Young |
| 6,016,063 | A | 1/2000 | Trimberger |
| 6,034,547 | A | 3/2000 | Pani et al. |
| 6,038,627 | A | 3/2000 | Plants |
| 6,051,991 | A | 4/2000 | Ting |
| 6,088,526 | A | 7/2000 | Ting et al. |
| 6,160,420 | A | 12/2000 | Gamal |
| 6,163,168 | A | 12/2000 | Nguyen et al. |
| 6,181,162 | B1 | 1/2001 | Lytle et al. |
| 6,320,412 | B1 * | 11/2001 | Ting et al. ............ 326/41 |
| 6,329,839 | B1 * | 12/2001 | Pani et al. ............ 326/41 |
| 6,417,694 | B1 | 7/2002 | Reddy et al. |
| 6,433,580 | B1 | 8/2002 | Ting |
| 6,507,217 | B2 | 1/2003 | Ting |
| 6,597,196 | B2 | 7/2003 | Ting |
| 6,670,825 | B1 | 12/2003 | Lane et al. |
| 6,686,768 | B2 | 2/2004 | Comer |
| 6,693,456 | B2 | 2/2004 | Wong |
| 6,781,410 | B2 * | 8/2004 | Pani et al. ............ 326/41 |
| 6,975,139 | B2 * | 12/2005 | Pani et al. ............ 326/41 |
| 2001/0007428 | A1 | 7/2001 | Young |

FOREIGN PATENT DOCUMENTS

| | | |
|---|---|---|
| EP | 0630115 A2 | 6/1994 |
| GB | 2180382 | 3/1987 |
| GB | 2295738 | 5/1996 |
| WO | 9208286 | 5/1992 |
| WO | 9410754 | 5/1994 |
| WO | 9428475 | 12/1994 |
| WO | 9504404 | 2/1995 |
| WO | 9528769 | 10/1995 |
| WO | 9605964 | 4/1996 |
| WO | 9635261 | 11/1996 |

OTHER PUBLICATIONS

ATMEL Field Programmable Arrays, AT 6000 Series, 1993, p. 1-16, Month N/A.

Britton, et al., "Optimized Reconfigurable Cell Array Architecture for High-Performance Field Programmable Gate Arrays," Proceedings of the IEEE 1993 Custom Integrated Circuits Conference, 1993, pp. 7.2.1-7.2.5, Month N/A.

Buffoli, E., et al., "Dynamically Reconfigurable Devices Used to Implement a Self-Tuning, High Performances PID Controller," 1989 IEEE, pp. 107-112, Month N/A.

Bursky, D., "Fine-Grain FPGA Architecture Uses Four Levels of Configuration Hierarchy," 2328 Electronic Design, 41, No. 20, Cleveland, OH, Oct. 1, 1993, pp. 33-34.

Cliff, et al., "A Dual Granularity and Globally Interconnected Architecture for a Programmable Logic Device", IEEE '93 pp. 7.3.1-7.3.5, Month N/A.

Devades, S., et al., "Boolean Decomposition of Programmable Logic Arrays," IEEE 1988, pp. 2.5.1-2.5.5, Month N/A.

F. Zlotnick, P. Butler, W. Li, D. Tang, "A High Performance Fine-Grained Approach to SRAM Based FPGAs", p. 321-326, Wescon Sep. 28-30, 1993.

Liu, D.L., et al., "Design of Large Embedded CMOS PLA's for Built-In Self-test," IEEE Transactions on Computed-Aided Design, vol. 7, No. 1, Jan. 1988, pp. 50-53.

Minnick, R.C., "A Survey of Microcellular Research", vol. 14, No. 2, Apr. 1967, pp. 203-241.

Motorola Project Brief,"MPA10xx Field Programmable Gate Arrays," Sep. 27, 1993, 2 pages.

Robert H. Krambeck, "ORCA: A High Performance, Easy to Use SRAM Based Architecture", p. 310-320, Wescon Sep. 28-30, 1993.

Shoup, R. G., "Programmable Cellular Logic Arrays," Abstract, Ph.D. Dissertation, Carnegie Mellon University, Pittsburgh, PA, Mar. 1970, (partial) pp. ii-121.

Sinan Kaptanoglu, Greg Bakker, Arun Kundu, Ivan Corneillet, Ben Ting, "A New High Density and Very Low Cost Reprogrammable FPGA Architecture", 10 pages, Actel Corpoation, Date N/A.

Spandorfer, L.M., "Synthesis of Logic Functions on an Array of Integrated Circuits," Contract No. AF 19 (628) 2907, Project No. 4645, Task No. 464504, Final Report, Nov. 30, 1965.

Sun, Y., et al., "An Area Minimizer for Floorplans with L-Shaped Regions," 1992 International Conference on Computer Design, 1992 IEEE, pp. 383-386, Month N/A.

Vidal, J.J., "Implementing Neural Nets with Programmable Logic," IEEE Transactions on Acoustic, Speech, and Signal Processing, vol. 36, No. 7, Jul. 1988, pp. 1180-1190.

Wang, P. et al. IEEE, "A High Performance FPGA with Hierarchical Interconnection Structure", pp. 239-242 (May 30, 1994).

Xilinx, "The Programmable Gate Array Data Book", 1992, Month N/A.

* cited by examiner

A = [m-n1+1:m]
B = [i1/n1-n2+1:i1/n1]
C = ij/n1/.../nj
D = n3x...xnj      n = n1x...xnj

EFFICIENT INTEGRATED CIRCUIT LAYOUT SCHEME TO IMPLEMENT A SCALABLE SWITCHING NETWORK USED IN INTERCONNECTION FABRIC

TECHNICAL FIELD

Embodiments of this invention relate to integrated circuit layout schemes in implementing a scalable switching network used in an interconnection fabric.

BACKGROUND

A switching network is comprised of ports with pins, conductors and switches. The ports and pins are external constructs of the switching network where each port contains a plurality of pins to interface to other switching networks or circuits. The conductors and switches are internal constructs of the switching network configured to transfer data or signals from pins of a first plurality of ports to pins of a second plurality of ports of the switching network. The pins of the first plurality of ports receive data or signals and transmit those data or signals through the conductors and the switches of the switching network to the pins of the second plurality of ports. The switching network can be bi-directional and in this case the pins of the first plurality of ports and the second plurality of port can both receive and transmit data or signals through the conductors and switches of the switching network. The pins of the ports of the switching network are physically connected to respective conductors of the switching network. The switches of the switching network can be programmed, either one time or repeatedly, to enable connection paths among the pins of the first plurality of ports to the pins of the second plurality of ports. The connection paths connecting pins inside the switching network can sometimes involve one or more intermediate conductors coupled through switches of the switching network.

Generally, the transmission of data or signals from the first plurality of ports to the second plurality of ports through the switching network can either be single-casting, where a pin of the first plurality of ports connects to a pin of the second plurality of ports, or can be multi-casting where data or signals of a pin of the first plurality of ports are transmitted to multiple pins of respective multiple ports of the second plurality of ports. The switching network can be used in an interconnection fabric for systems, networks and routers, etc, it can also be used as programmable interconnect circuitry for programmable logic circuits. In the case of programmable logic circuits, the multicasting corresponds to a source (output) connecting to multiple sinks (inputs) which is generally expressed as the fan-out of an output or fan-in of the inputs. For ease of illustration and consistency with the conventional way to describe such technologies, each switching network under discussion is denoted as having a first set of m conductors (having m number of conductors, for example) connecting to the pins of the first plurality of ports of the switching network. Without loss of generality, the first plurality of ports can be illustrated by a first port with m number of pins. The second plurality of ports is denoted as having k ports where each of the k ports has at most n number of pins. Additionally, there are n sets of conductors where each of the n sets of conductors having at most k number of conductors. Thus the switching network can be used to connect the pins of the first port to the pins of the k ports through use and control of switches and conductors of the switching network. Each pin of the first port is capable of connecting to at least one pin to each of the k ports through the switching network. Typically, multiple numbers of pins of the first port can independently connect to the pins of the k ports using the switching network without blocking.

FIG. 1 illustrates a conventional j-stage switching network (the "j-SN") 1, where j is an integer, as described by Pani et al. (U.S. Pat. No. 6,975,139; hereinafter, "Pani"). The j-SN 1 has a first port 101 having m number of pins which are physically connected or coupled to the m conductors 10. Each of the k ports 102-108 has up to n=(n1× ... ×nj) number of pins which are physically connected or coupled to the conductors of respective n plurality of at most k number of conductors 161 (112, 113, . . . , 117, 118); (122, 123, . . . , 127, 128); . . . ; and 163 (142, 143, . . . , 147, 148). Functional Blocks 102, 103, . . . , 107, 108 FB(i) for i=[1:k] represents either a set of lower level switching networks connecting to the j-SN of FIG. 1 or a set of circuit blocks connecting to the j-SN. Each of the ports 102, 103, 107 and 108 of FIG. 1 can be considered as the first port of the corresponding FB(i)'s.

Referring to FIG. 1, the m conductors (the first conductors) 10 are divided to form n1 sets of overlapping conductors each one having A number of conductors of 10 for A ranging between (m−n1+1) to m. The n1 sets of first conductors 11 through 12 can be configured to selectively couple an intermediate set of conductors having i1 number of conductors (the second conductors) for i1 ranging between m and (k×n). The i1 number of conductors are divided into n1 non-overlapping sets of second conductors, each set having approximately i1/n1 number of conductors corresponding to 15 through 16 of FIG. 1. Each of the n1 sets of first conductors 11 through 12 are coupled to a corresponding set of second conductors 15 through 16 through a corresponding sets of switches 13 through 14 each having A number of switches for s1(i) where i=[1:n1].

The conductors 15 are divided into n2 sets of overlapping conductors 105, . . . , 115, where each set has B number of conductors for B ranges between [i1/n1−n2+1: i1/n1]. In the embodiment of FIG. 1, each of the B number of conductors 105 are configured to selectively couple a next set of conductors 145 which is a non-overlapping subset of i2 number of conductors through a switch box 125 s2(1,1) having B number of switches. The i2 number of conductors (the third conductors) has between i1 number of conductors and (k×n) number of conductors which are divided into (n1×n2) sets of non-overlapping sets of conductors 145, . . . , 155, . . . , 146, . . . , 156 as illustrated in FIG. 1, the number of conductors in each of the (n1×n2) sets of non-overlapping conductors of i2 number of conductors 145, 155, 146, 156 etc. is approximately i2/n1/n2. Similarly, conductors 16 are divided into n2 sets of overlapping conductors 106, . . . , 116 which in turn couple, through respective sets of switches 126, . . . , 136 to n2 sets of non-overlapping conductors 146, . . . , 156.

Thus a parental set of i1/n1 number of second conductors 15 are divided into n2 sets of overlapping conductors each having between (i1/n1−n2+1) to i1/n1 number of conductors where each of the n2 sets of parental conductors (105, . . . , 115) couples, through a set of switches 125 having between (i1/n1−n2+1) to i1/n1 number of switches, to a set of child conductors 145 having approximately i2/n1/n2 number of third conductors. The children conductors (145, . . . , 155), (146, . . . , 156) are consisted of (n1×n2) sets of non-overlapping conductors having approximately i2/n1/n2 conductors in each of the (n1×n2) sets. The process described above can continue for the j-SN 1 when j is greater than two.

Referring to FIG. 1, there are (n1× ... ×nj) number of non-overlapping sets of C number of conductors 110, . . . , 120, . . . 130, . . . , 140 as the last j stages of intermediate conductors in the j-SN 1, where C=ij/n1/ . . . /nj for ij ranging between $i_{(j-1)}$ and (k×n) where $i_{(j-1)}$ is the number of conductors of the parental conductors and ij is the children conductors for j greater than two. Each set of the C number of conductors such as the first set 110 is configured to selectively couple, through switches 111 which has (C×k) number of switches, to k number of conductors 112, 113, . . . , 117, 118 which are physically connected to k pins in each of the k ports (as pin 1 in ports 102, . . . , 103, . . . , 107, . . . , 108 of 161) having up to n number of pins in each port. Each of the k ports is either associated with another switching network or a functional block.

In the case of j=1, i.e., 1-SN, conductors 15 would be represented by the first set of conductors 110 of FIG. 1 while the parental sets of conductors (105, . . . , 115, . . . , 106, 116) through (145, . . . , 155, . . . , 146, . . . , 156) do not exist. Additionally, there are only n1 sets of conductors of the type represented by the first set of conductors 110 and respective number of sets of switches represented by the switches 111 in this case.

In the case of 2-SN, the types of conductors 145 would be represented by the first set of conductors 110 of FIG. 1, so there are only (n1×n2) sets of conductors 110 types of conductors and ditto sets of switches represented by switches 111.

In the physical implementation of a switching network onto an integrated circuit, there are trade-offs in terms of layout efficiency. Typically, switches are larger than wires or conductors in terms of area. With present processing manufacturing technology, it is not yet practical to stack devices on top of each other in an integrated circuit but it is possible to allow conductors to be implemented in multiple layers of interconnections on top of the area occupied by switches. Thus, one can investigate the relationships between the numbers of switches versus the numbers of conductors in a switching network to achieve an efficient layout implementation in an integrated circuit. Ideally, if the conductors can be implemented within the area occupied by the switches, then there is little area wasted; hence, the implementation can be considered optimum for the integrated circuit. Area minimization in layout implementation is important both for manufacturing cost and speed considerations. Thus, it is important to consider the layout efficiency of the switching network while implementing an interconnection fabric.

BRIEF DESCRIPTION OF THE DRAWINGS

The objectives, features, and advantages of embodiments of the present invention will be apparent from the following detailed description in which.

DETAILED DESCRIPTION

Figure 1:
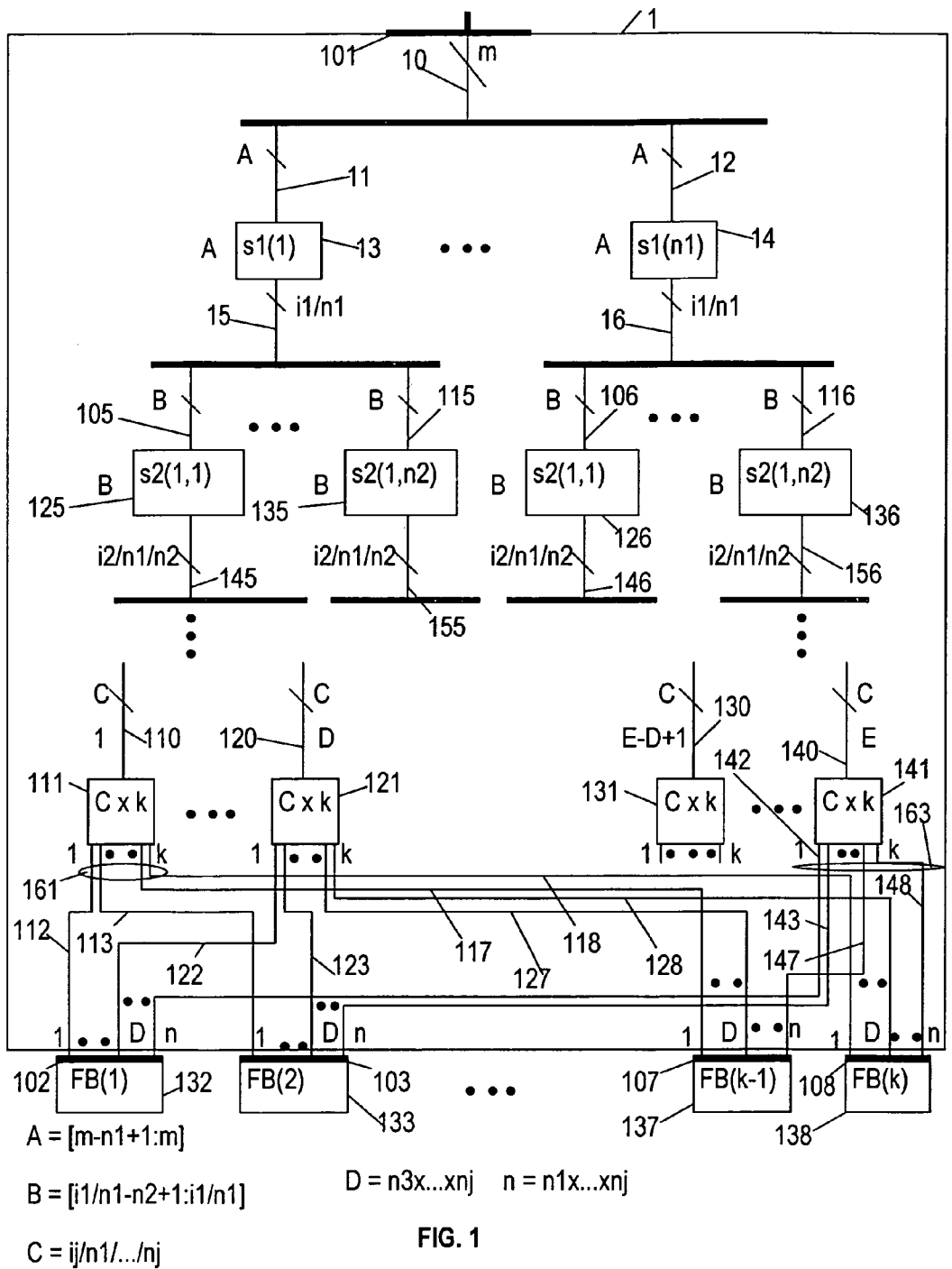
FIG. 1 illustrates a conventional switching network.

Layout schemes to implement a switching network used in an interconnection fabric, for example, as disclosed by the present inventors in Pani and U.S. patent application Ser. No. 10/909,810, filed Jul. 29, 2004, in an integrated circuit are described. In alternative embodiments, the layout schemes described herein may be used to implement other switching networks.

In the following description, for purposes of explanation, numerous specific details are set forth in order to provide a thorough understanding of embodiments of the present invention. It will be apparent to one skilled in the art that embodiments of the present invention may be practiced without these specific details. In other instances, well-known structures and circuits are shown in block diagram form in order to avoid unnecessarily obscuring embodiments of the present invention.

For purpose of description, unless otherwise specified, the terms program controlled switch, and switch are interchangeable in the context of this description. The term port comprises a plurality of pins where each of the pin is physically connected to a conductor of the switching network in this disclosure. The term functional block can be either a switching network or a logic circuit comprising integrated devices and/or programmable logic cells. Furthermore, the term "to connect" as used in the current description may include both to directly connect and to indirectly connect (for example, inserting a driver or repeater to boost signal strength). Likewise, the term "to couple" as used herein may include both to directly couple and to indirectly couple.

The design of an integrated circuit (IC) requires that a layout be designed which specifies the arrangement of the various circuit components that will result on the major surface of the integrated circuit substrate; that is referred to as an integrated circuit layout. In generating integrated circuit layouts, designers may typically use electronic design automation ("EDA") tools. An EDA tool generates layouts by using geometric shapes that represent different materials and components on an integrated circuit. For example, an EDA tool may use rectangular lines to represent the conductors that interconnect integrated circuit components. An EDA tool may illustrate component ports with pins on their sides. These pins connect to the interconnect conductors. A net may be defined as a collection of pins that need to be electrically connected. A list of all or some of the nets in an integrated circuit layout is referred to as a netlist. A netlist specifies a group of nets, which, in turn, specify the required interconnections between a set of pins.

In one embodiment, a machine readable medium may be used to store data representing an integrated circuit design layout. The integrated circuit layout may be generated using a netlist or other means, for examples, schematics, text files, hardware description languages, layout files, etc. The integrated circuit layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided herein.

In the physical layout of components of an integrated circuit, it is common to refer to a conductor laid out along either a first dimension as a horizontal wire or conductor in a track or along a second dimension as a vertical wire or conductor in a track belonging to a layer of interconnections. A track is a layout unit along a dimension where one or more conductors can be laid out co-linearly along the track while conforming to manufacturing process rules in the context of a given layer of interconnections. In some embodiments, a track can be along an angular direction such as forty-five degrees, hence when we refer to a dimension such as a first dimension or a second dimension, the track can either be horizontal, vertical or of an angular direction.

It should also be noted that some embodiments of the present invention use program control devices to set the states of switches utilized. The control devices may include single-use programmable control devices, such as fuse/anti-fuse technologies, or re-programmable control devices, such as SRAM (which is volatile), FLASH (which is non-volatile), Ferro-electric (which is non-volatile), etc. Moreover, embodiments of the present invention pertain to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

A switch connecting two wires or conductors usually has a control mechanism which can be programmed at least once. Once the control is determined and is programmed in a switch, the two conductors are either connected electrically or the circuit between the two conductors is "open" or non-conducting. There are multiple ways to implement a switch, depending on technology used and circuit design techniques. The control mechanism is generally a memory bit in re-programmable technology and anti-fuse programming lines in one-time programmable technology to select a conducting path between the two conductors through the switch. In the case where multiple numbers of incoming conductors are to be connected to a single source conductor, a multiplexer is commonly used to consolidate the many individual switches. It is generally preferable to implement the circuits of a switch or multiple consolidated switches in a contiguous area as a basic layout unit to reduce layout area.

Figure 2:
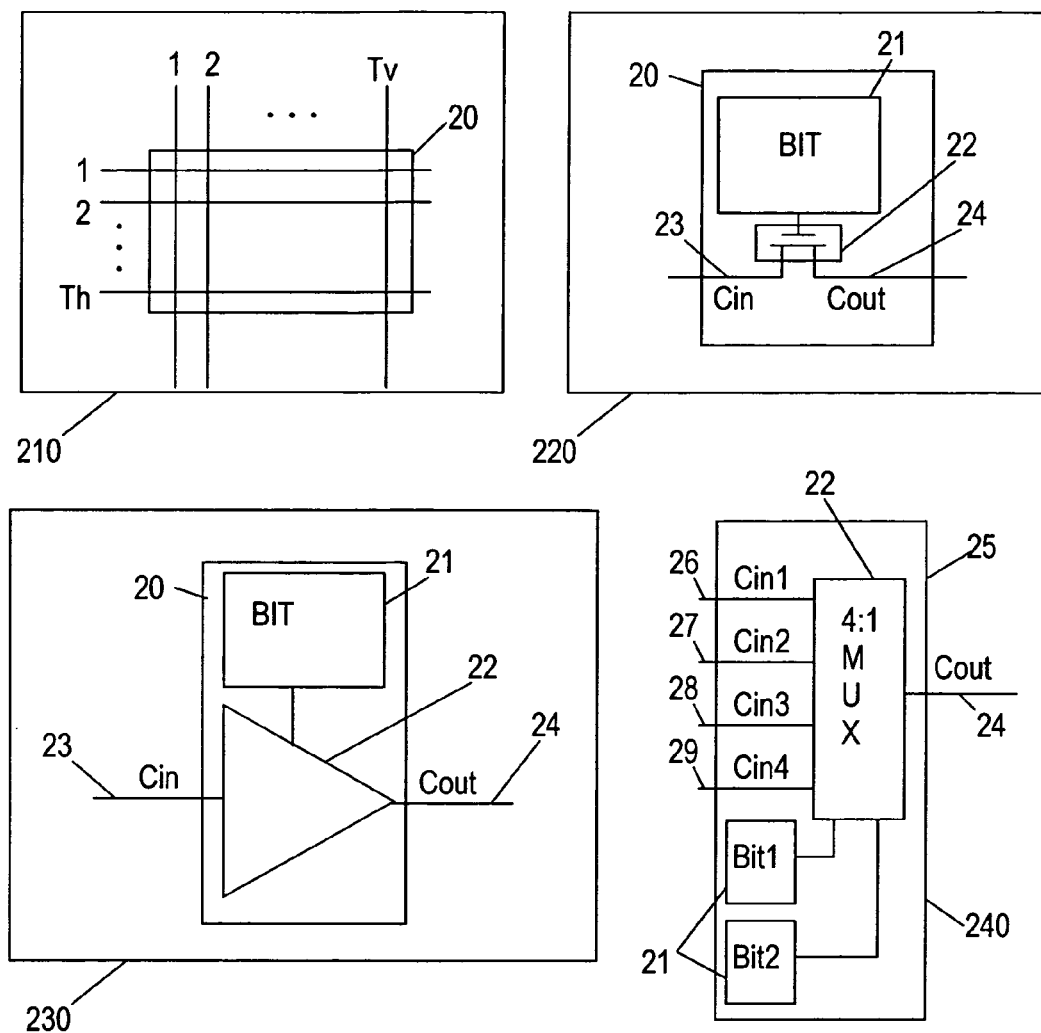
FIG. 2 illustrates various embodiments of a switch.

In the various embodiments of FIG. 2, a basic layout unit 20 can be implemented in multiple ways, dependent upon various parameters, such as the particular area and speed considerations of the circuit design requirements. FIG. 2 illustrates some embodiments of various implementations of the basic layout unit 20. The embodiment 210 of FIG. 2 is a symbolic black box representation of the basic layout unit 20 with Tv number of vertical tracks (along a second dimension) and Th number of horizontal tracks (along a first dimension), which is available for conductors to be laid out on top of the switching device with multiple layers of interconnections. The embodiment 220 is a representation of the basic layout unit 20 with a memory bit 21 controlling a switch 22 between two conductors 23 (Cin) and 24 (Cout). The switch may be implemented using a passgate. When the load connecting conductors 23 to 24 is high, a driver may be added to improve the speed of the interconnection connecting conductors 23 to 24. The embodiment 230 illustrates one possible configuration where a three-state driver 22 is controlled by a memory bit 21 or a state of the memory bit 21.

In some embodiments, it is possible to save some area in circuit implementation using multiplexers instead of one bit per switch control. The embodiment 240 includes a four to one MUX 22 used to connect between four conductors 26-29 (Cin1-Cin4) to one conductor 24 (Cout). There are two bits 21 to generate four states to control four switches in the embodiment 240, so effectively there are four basic layout units of 20 in the embodiment 240 even though there is no single clearly marked unit 20. For one skilled in the art, it should be readily observed that, the area of the different embodiments 220, 230 and 240 for the basic layout unit 20 can be different, and thus, the Tv and Th counts can vary for different implementations of the basic layout unit 20. In some embodiments, a number of substantially identical basic layout units 20 are arranged in a row organized along a first dimension. The basic layout units 20 in different rows may be different and the widths (measured by the number of tracks in the Tv dimension) are substantially the same while the height (number of tracks in the Th dimension) may vary from row to row in various layout implementation.

Figure 3:
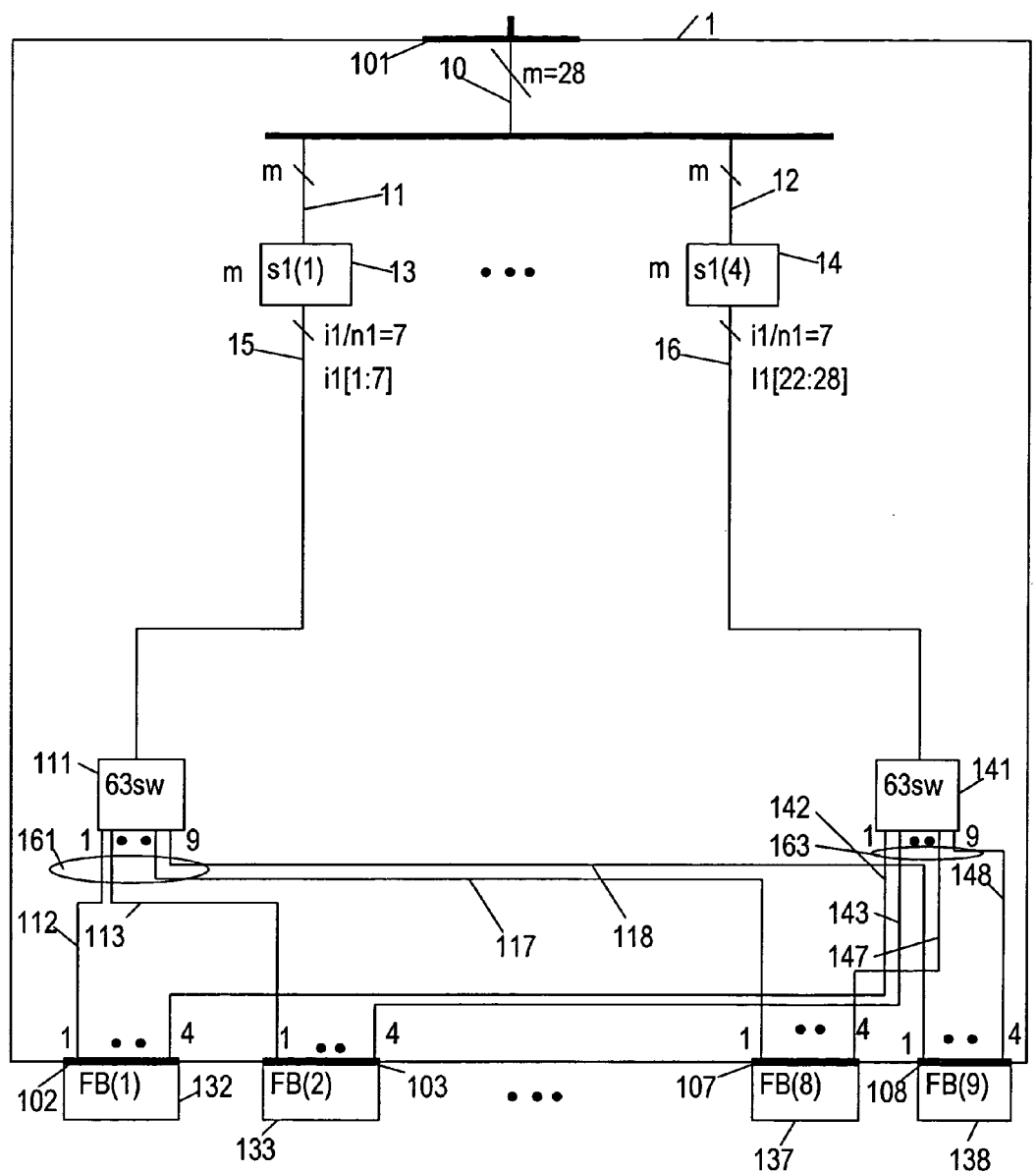
FIG. 3 illustrates a corner case of one embodiment of a 2-SN switching network.

FIG. 3 illustrates one embodiment of a 1-SN, where j=1, m=28, k=9, n1=4, A=m and i1=m. Each of the m number of first conductors 10 is used four times as conductors 11, ..., 12 to respectively couple to four non-overlapping sets of conductors from i1 number of conductors 15, ..., 16 through respective sets of switches 13, ..., 14, each having m number of switches as shown in FIG. 3 where m is twenty eight and i1 is also twenty eight. The 1-SN described in Pani provides each of conductors 11, ..., 12 of FIG. 3 ranging between (m−n1+1) to m and i1 ranging between m to (k×n1). In FIG. 3, conductors 15 is shorted to conductors 110 of FIG. 1, skipping the general j-SN for j=1 and there are seven i1 or second conductors in conductors 15 labeled i1[1:7]. Similarly, conductors 16 is shorted to conductors 140 of FIG. 1 and there are seven i1 conductors in conductors 16 labeled i1[22:28]. Each of the four sets of non-overlapping i1 conductors 15, ..., 16 are connected to a respective set of switches of the four sets of switches in 111, ... 141 in FIG. 3, where each set has sixty three switches. The n1 sets of approximately i1/n1 number of conductors 15-16 are selectively coupled through respective n1 sets of switches each having sixty three switches 111-141 in FIG. 3. The n1 sets of switches 111-141 in turn are coupled to (n1=4) sets of (k=9) number of (k×n1) conductors or the third conductors 161 (112, 113, ..., 117, 118), ..., 163 (142, 143, ..., 147, 148). Each k number of the third conductors in each n1 sets are respectively connected to one pin in each of the k ports 102-108 of the functional blocks 132-138. Thus conductors 112, 113, ..., 117, 118 are physically connected to one pin of a respective port among the k ports 102-108, etc. The embodiments of FIG. 3 illustrate a corner case by setting each of conductors 11, ..., 12 to have m number of conductors (all n1 sets are completely overlapping) and i1=m where, for one skilled in the art, the other possible permutations can be similarly deducted.

Figure 4:
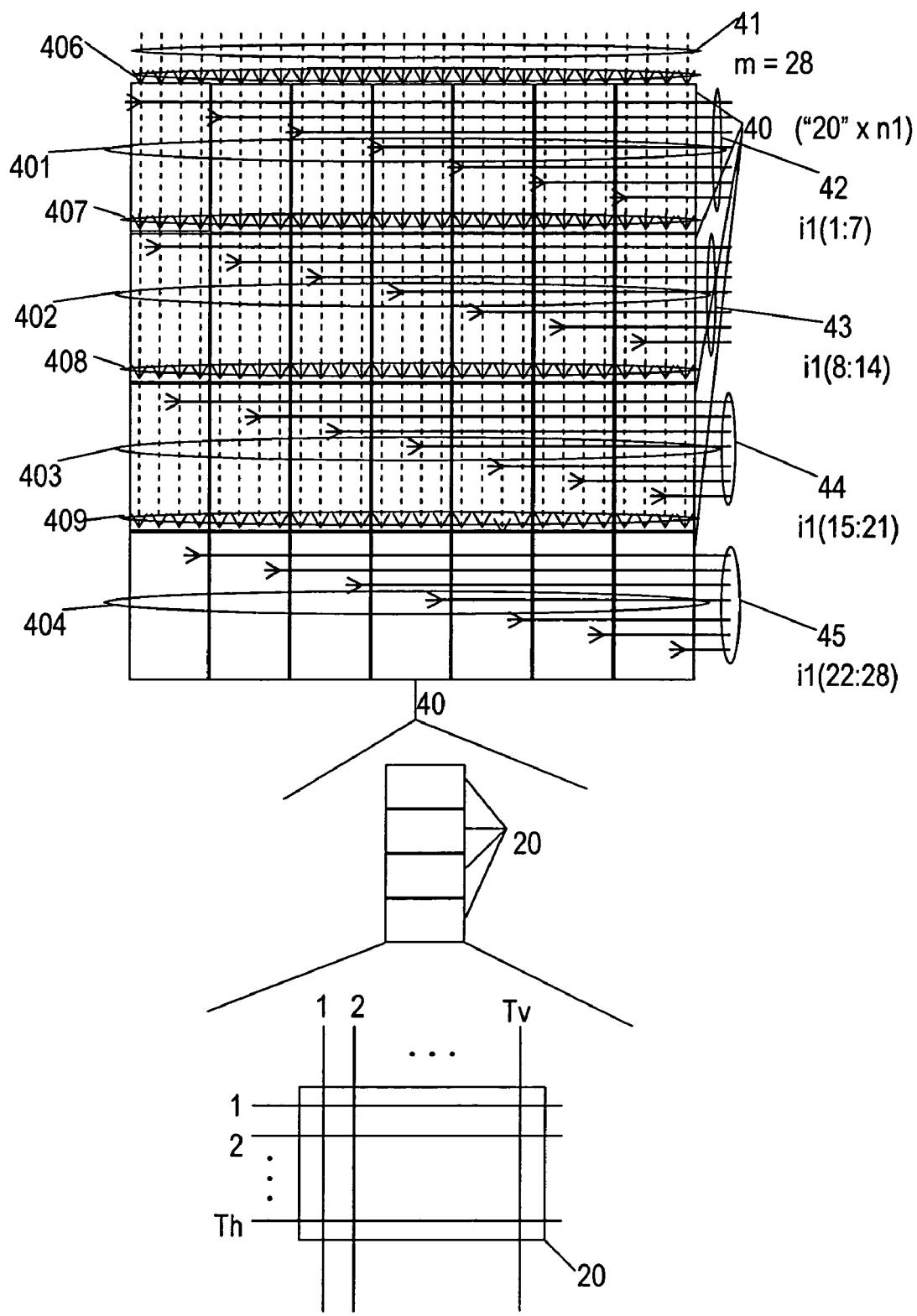
FIG. 4 illustrates one embodiment of a layout organization of a portion of switching network of FIG. 3.

FIG. 4 illustrates one embodiment of a layout organization of a portion of a switching network. The embodiments in FIG. 4 illustrate a portion of a SN switching network between two sets of conductors: the first conductors being 11, ..., 12 and the second conductors being 15, ..., 16 where there are four rows and seven columns of layout units 40 comprising the integrated circuit layout area occupied by the switches 13, ..., 14 of FIG. 3. Layout unit 40 includes n1 number of basic layout units 20, such as those described with reference to FIG. 2. In some embodiments, unit 40 includes four units of the basic layout unit 20 in a four rows by one column configuration. Alternatively, the four basic layout units 20 may be arranged in other configurations, such as one by four or two by two. The actual configuration of unit 40 may depend on a variety of factors, such as the circuit implementation of the various switches and the number of tracks required for the interconnections over the layout area and the number of interconnection layers available, etc.

As illustrated in FIG. 2, there are various implementations of the basic layout unit 20. Thus, there may be multiple basic layout units 20 of different implementations. Thus, layout unit 40 of FIG. 4 can have many variations, such as multiple memory bits/switches, or a four to one MUX implementation. The four to one MUX implementation may use memory bits generated states as controls, which may be implemented in a replicable unit area and may have different configurations, such as a (1×4), (4×1), or (2×2) configuration in terms of layout units 20 of FIG. 2.

Referring to FIG. 4, the first row 401 has seven units (i1/n1=7) of layout units 40 which correspond to the first set of switches 13 of FIG. 3. Thus, each layout unit 40 of each row represents the number of switches used to couple the same number of m conductors (the first conductors) to one i1 conductor. The second row 402 represents the second set of switches with m=28 number of switches. The third row 403 represents the third set of switches and lastly, the fourth row 404 corresponds to the fourth set (or the n1-th set) of switches 14 of FIG. 3. In one embodiment, the m conductors or the first conductors 41 and the i1 conductors or the second conductors 42, 43, 44, 45 are running along two different dimensions over the switches area. The first conductors 41 are divided into four (n1) sets of completely overlapping sets (corresponding to 11, . . . , 12 of FIG. 3) connecting to the respective rows (401, 402, 403, 404) of seven units of 40 at 406, 407, 408, 409 respectively. The n1 sets (n1=4) of non-overlapping i1 conductors (each set having seven second conductors) 42, 43, 44, 45 are connected to the respective row of switches in 401, 402, 403, 404, which are shown symbolically in FIG. 4. So there are (m=28) number of tracks used to layout the first conductors 41 along the vertical dimension and (i1=28) number of tracks to layout the second conductors 42, 43, 44, 45 along the horizontal dimension. In some embodiments, the first conductors 41 are laid out in a different layer(s) of interconnection from the second conductors 42, 43, 44, 45. The seven conductors in each of the second conductors 42 i1(1:7), 43 i1(8:14), 44 i1(15:21), 45 i1(22:28) are distributed along the second dimension vertically in respective seven units of basic layout units 40 across a respective row 401, 402, 403, 404, where each of the respective seven conductors in each of the second conductors 42, 43, 44, 45 are in proximity together along the first dimension horizontally. For one skilled in the art, it should be readily appreciated that the layout area of switches 111, . . . , 141 of FIG. 3 would be located to either the left or the right of the switches 13, . . . , 14 of FIG. 4, etc. for ease of connections between the second conductors 15, . . . , 16 and the third conductors 151, . . . , 152 of FIG. 3.

Figure 5:
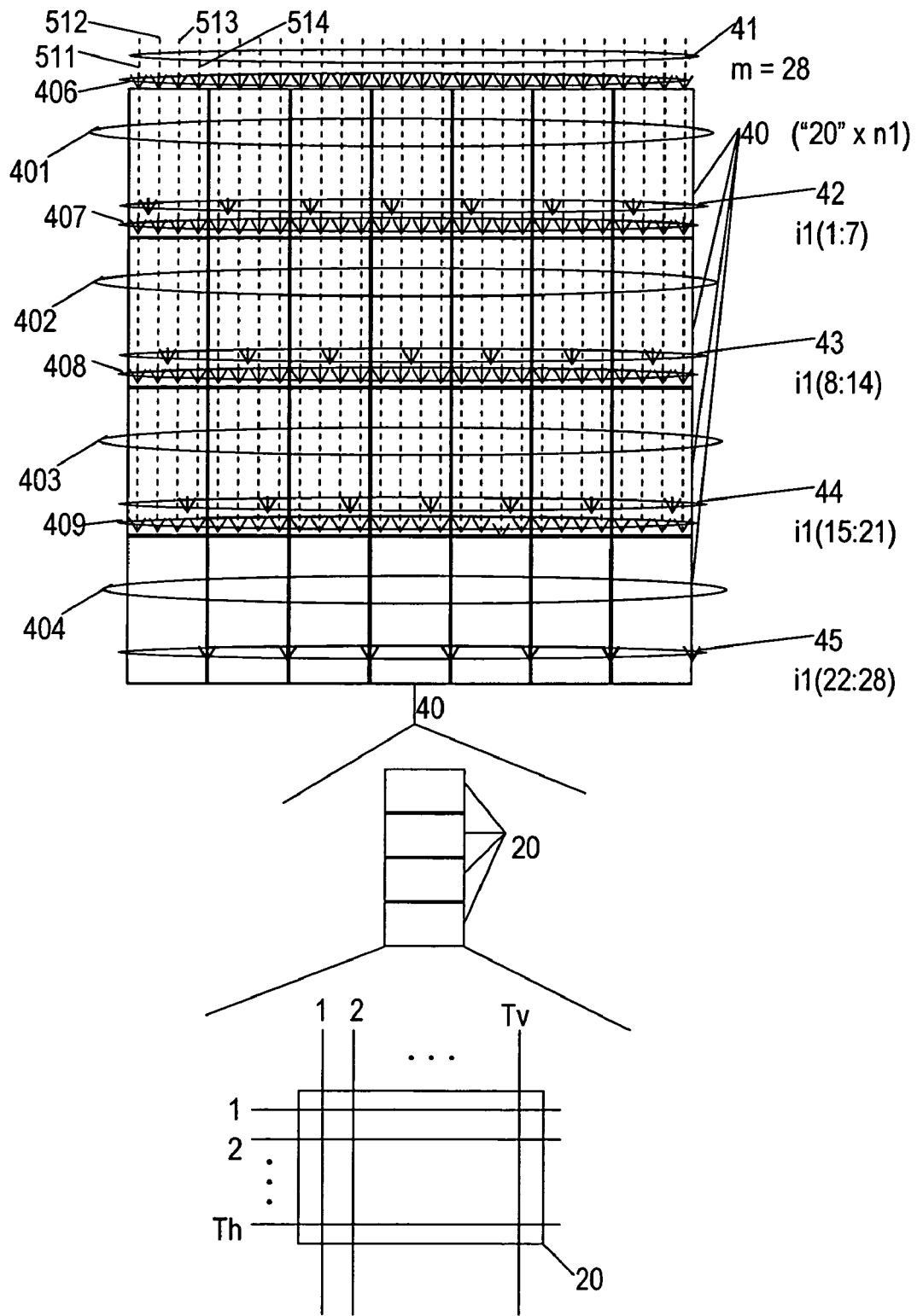
FIG. 5 illustrates another embodiment of a layout organization of a portion of switching network of FIG. 3.

FIG. 5 illustrates an alternative scheme of layout. Referring to FIG. 5, the twenty-eight m conductors, or the first conductors 41 (corresponding to conductor 10 of FIG. 3) are parallel in the second dimension vertically. The twenty-eight m conductors are connected to one side of each of the four rows of switches in 401, 402, 403, 404 and are also connected to the respective switches at 406 (corresponding to 11 of FIG. 3), 407, 408, 409 (corresponding to 12 of FIG. 3). On the other side of each row of switches, there are seven i1 conductors (second conductors) 42 of row 401 which corresponds to 15 of FIG. 3 and labeled as i1[1:7], the seven i1conductors 43 of row 402 are labeled as i1[8:14]. Likewise, the seven i1 conductors 44 of row 403 are labeled as i1[15:21], and the seven i1 conductors 45 of row 404 are labeled as i1[22:28], which correspond to 16 of FIG. 3. One difference between the embodiments of FIG. 5 and those of FIG. 4 is that the second conductors are oriented along the same dimension as the first conductors instead of being oriented along a different dimension than the first conductors.

The seven i1 conductors 42 (i1[1:7]), 43 (i1[8:14]), 44 (i1[15:21]), 45 (i1[22:28]) in each of the respective rows 401, 402, 403, 404 are distributed across the seven basic layout units 40 physically in FIG. 5. In FIG. 3, each of the four sets of i1 conductors 15 (i1[1:7]), . . . , 16 (i1[22:28]) are connected to a respective set of switches 111, . . . , 141. In order for the seven conductors of 15 of FIG. 3 to connect to the sixty-three switches of switch 111 physically, the corresponding seven i1 conductors 42 of FIG. 5 may be aligned in sequence in proximity together. Likewise, the remaining three groups of seven i1 conductors 43, 44 and 45 may be re-sequenced physically in proximity in groups of seven. It is thus clear that there are relations between the pitch or the size of basic layout unit 20 and the resulting basic layout unit 40 in FIG. 5, where the number of tracks along the first and the second dimensions and the number of available layers of interconnections can be used to determine whether the layout of the switching network is relatively efficient. For example, the efficiency in the layout may be relatively high if all the various conductors can be laid out on top of the active areas defined by the switches.

It is important to note that the height of each row 401, 402, 403, 404 of FIG. 4 and FIG. 5 need not be the same. Rather, the possible different heights are function of the manner in which basic layout units 40 of each row are implemented based on various considerations, such as circuit design, speed, load, etc. Hence, the associated number of horizontal tracks can vary from row to row. In some embodiments, the pitch of each row 401, 402, 403, 404 of FIG. 5 along the horizontal dimension is substantially the same to maintain a more rectangular area in layout to reduce waste. When some intermediate conductors ir is larger than the previous stage, the number of switches in the rows associated with the ir conductors is wider. In this case, the layout area may not be of even row width but the resulting network can have improved connectivity.

Figure 6:
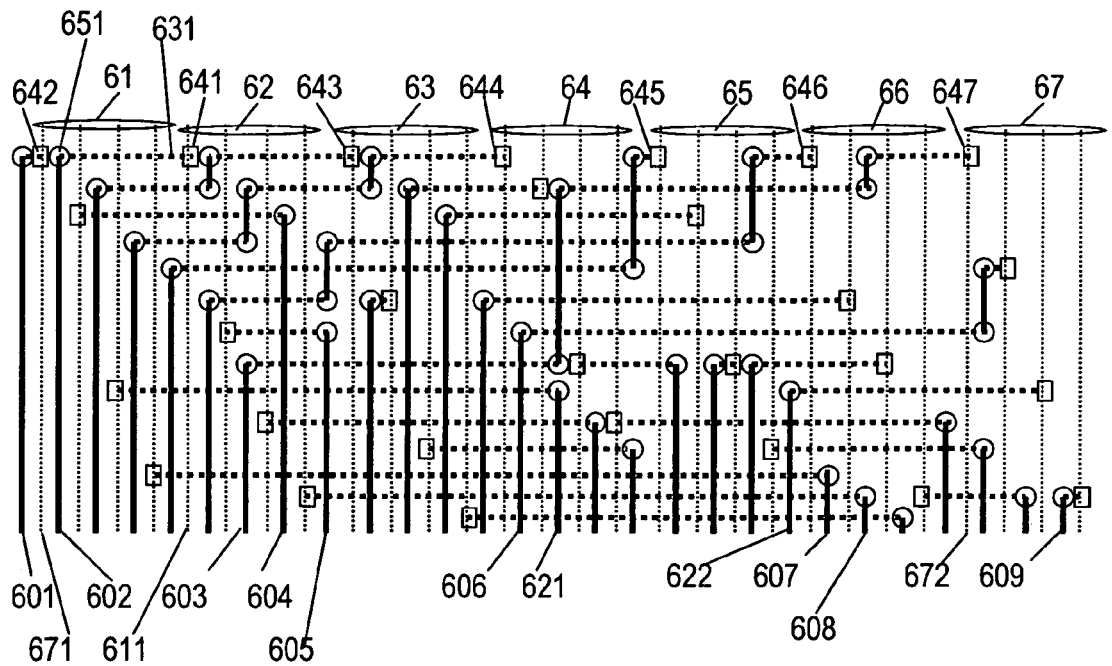
FIG. 6 illustrates one embodiment of layout organization of two sets of conductors of FIG. 3.

FIG. 6 illustrates one embodiment of the physical implementation of the m conductors 41 of FIG. 5 which are used four times (n1 sets of overlapping first conductors) as 406, 407, 408, 409 to connect, respectively, to the switches of the four rows 401, 402, 403, 404 and the four non-overlapping sets of i1 conductors (second conductors) 42 (11 of FIG. 3), 43, 44, 45 (12 of FIG. 3), which are respectively connected to the switches of the four rows, along the same dimension (e.g., vertically) with i1 conductors requiring additional tracks along the other dimension (e.g. horizontally) to re-align or re-sequence the four sets of i1 conductors 15, . . . , 16 of FIG. 3, prior to connecting to the switches of 111, . . . , 141 of FIG. 3. Given that there are Tv number of vertical tracks and Th number of horizontal tracks in the basic layout unit 20, if the layout track count of FIG. 6, in both dimensions, is well within the area prescribed in FIG. 5, then there is little waste in silicon layout area in that the circuit is defined by the active area. Consequently, this is considered to be about 100% efficient.

Referring to FIG. 6, there are twenty eight first conductors (m conductors) 610 (611 is part of 610) in layer v1 which are represented by vertically dotted lines. Additionally, there are similar number of second conductors (i1 conductor) 620 (601, 602, . . . , 609, etc.) running along the same v1 layer. In one embodiment, a single track in the Th direction can re-align an average of two i1 conductors using one interconnection layer h1.

The four first conductors in each of conductors 61, 62 and 67 of FIG. 6 correspond to each of the n1 (four) consecutive first conductors in the conductors 41 of FIG. 5. For example, conductors 511, 512, 513, 514 of FIG. 5 are the same n1 number of first conductors of the conductors 61 of FIG. 6. Correspondingly, conductor 511 connects to n1 number of the respective basic layout units 40 of FIG. 5 column-wise, and thus, the portion of 406 associated with the conductor 511 in FIG. 5 can be considered as the first m conductor of conductors 11 connecting to switches 13 of FIG. 3, the portion of 409 associated with the conductor 511 in FIG. 5 can be considered as the same first m conductor of condcutors 12 connecting to switches 14 of FIG. 3, etc. Similarly, the portion of 406 associated with the conductor 512 in FIG. 5 can be considered as the second m conductor of condcutors 11 connecting to switches 13 of FIG. 3, the portion of 409 associated with the conductor 512 in FIG. 5 can be considered as the same second m conductor of condcutors 12 connecting to switches 14 of FIG. 3, etc. The first seven (i1/n1) second conductors of 620 in proximity of vertical tracks 601, 602, . . . , 603 along the second dimension in FIG. 6 originate at distributed locations 642, 641, 643-647 along the first dimension at the respective first track of respective n1 number of first conductors 61-67 along the second dimension. Thus, the contact/via location of conductor 642 is along the first track 671 of the conductors 61, 641 is along track 611 of the conductors 62 etc., and the last 647 of the first seven (i1/n1) second conductors of 620 is along track 672 of the conductors 67. Each of the next three sets of (i1/n1) number of second conductors (604, . . . , 606), (621, . . . , 622), (607, . . . , 609) are similarly distributed along the first dimension and re-aligned in proximity along the second dimension.

Each of the n1 sets of (i1/n1) number of conductors originating at 640 aligning to the respective tracks of the first conductors in the conductors 61-67 of FIG. 6 are distributed over 61-67 along the first dimension. Each of those n1 sets of (i1/n1) number of conductors are to be re-aligned in proximity along the second dimension using respective tracks of (601, . . . , 603), (604, . . . , 606), (621, . . . , 622), and (607, . . . , 609); tracks along the first dimension will be required to interconnect those conductors originating at 640 along tracks of the first conductors to those tracks along (601, . . . , 603), (604, . . . , 606), (621, . . . , 622), and (607, . . . , 609) in FIG. 6. In some embodiments, the number of tracks required along the first dimension is half the number of second conductors that is approximately (i1/2). For example, the number of tracks along the first dimension in FIG. 6 is fourteen. The tracks along the first dimension are shared co-linearly by the i2 conductors so there are half as many tracks as the number of conductors that are to be re-aligned across the layout area. There are various implementation schemes in the actual layout, FIG. 6 illustrate one embodiment of layout scheme where multiple i1 conductors or second conductors can share a track co-linearly along the first dimension for some tracks and only one i1 conductor for some other tracks. With one layer of interconnections, i1/2 number of tracks along the first dimension is required to re-align the i1 number of conductors.

In terms of interconnection order in physical layers for the layout embodiment in FIG. 6, a contact 640 (also referred to as a via) at a lower level of interconnection layer is coupled to conductor 630 conductor layer h1, which is at a lower conductor layer than layer v1, while conductor 630 can connect to conductor 620 through a via 650, which is at a higher level than the contact 640. The connection path for the i1 conductor 602 starts at contact/via 641 of the contact 640 which is underneath the m conductor 611 of 62 and connecting to the conductor 631 in layer h1, to a via 651, which is a higher level via of 650, connecting to 602 in layer v1. For the twenty eight i1 conductors 620, the re-alignment requires half the number in terms of layer h1 tracks, which is fourteen in FIG. 6. There may be an average of two i1 conductors per track using one layer of interconnection. There are many alternative embodiments in the detailed re-alignments different from the example embodiments of FIG. 6 using one layer of interconnect; however, the minimum tracks required is bounded by the factor 0.5, or the number of tracks required is half the number of conductors to be re-aligned. For one skilled in the art of layout implementation, it can be readily realized that by adding one additional layer of interconnections, parallel to the i1 or the second conductors 630 and orthogonal to the m or the first conductors 610 and 620, the number of tracks required for re-alignment per layer can be further reduced by another factor of two. Similar reductions can be achieved with yet additional layer of interconnections.

In the area defined by the embodiments of FIG. 5, there are (Tv×i1/n1) vertical tracks and (Th×n1×n1) horizontal tracks when unit 40 is organized in a (4×1) configuration, if only two layers are used for the implementation of the m conductors and i1 conductors, then it may be sufficient for Tv=8 and Th=1 to implement fifty six vertical m and i1 conductors and fourteen tracks to re-align the twenty-eight i1 conductors in FIG. 6 for (n1=4). As discussed above, the layout unit 40 of FIG. 5 can be organized in many different ways, for example, basic layout unit 40 can be organized in (2×2) units of unit 20 instead of (1×4) as illustrated in FIG. 5. In this case, Tv=4 and Th=2 would meet the two layers solutions requirements of FIG. 6. It is readily understood, for one skilled in the art, that there are possibly lower levels of interconnection layers that are used to interconnect the actual circuit devices to the layers used by the contact 640 in FIG. 6. Those lower level layers can have tracks available for interconnection thus the track counts required by either the h1 layer or the v1 layer can be reduced by the available lower level layers. Hence one can optimize and determine the overall tracks required in either dimension for a switching network using the style of layout implementation illustrated in FIG. 3 through FIG. 6 based on the layout unit 40 configuration, type of circuits implemented, number of interconnections layers available, layout design rules, etc.

The embodiments of FIG. 3 through FIG. 6 illustrate a mechanism to lay out two groups of conductors, connecting through switches, over the active area defined by the switches for a switching network, using multiple layers of interconnections with corner case parameters whereby setting each of 11, . . . , 12 of FIG. 3 to have m number of conductors (all n1 sets are completely overlapping) and i1=m. For one skilled in the art, it would be apparent that the other possible permutations using other parameters of the switching network may follow the same layout scheme over a switching area that is different in shape and/or size.

Generally, the first set of conductors having m number of conductors (also referred to as the first conductors) are divided into n1 sets of overlapping conductors, where each of the n1 sets of the first conductors having y number of conductors for y ranging between (m−n1+1) to m. The second set of conductors having i1 number of conductors (also referred to as the second conductors) are divided into n1 sets of non-overlapping conductors where each of the n1 sets of the second conductors has approximately i1/n1 number of first conductors for i1 ranging between m and (k×n1). Each of the n1 sets of overlapping first conductors having y number of conductors are connected to a respective n1 sets of non-overlapping second conductors having approximately i1/n1 number of conductors through a respective n1 sets of switches, each having y number of switches. Thus there are approximately [y/(i1/n1)]=(y×n1)/i1 number of first conductors and switches connecting to every second conductors for a total of (y×n1) number of switches or similar circuit implementations. The y number of switches of the respective set of n1 sets of switches are grouped as (i1/n1) units (e.g., number of units 40 in 401, 402, etc. of FIG. 5) of [y/(i1/n1)] number of switches (e.g., basic layout unit 40 of FIG. 5, which is equal to n1 times the number of switches in layout units 20) organized in a row along a first dimension connecting to the y number of first conductors of the set of n1 sets of overlapping first conductors along a second dimension. Additionally, approximately i1/n1 numbers of second conductors are connected to the y number of switches distributed over the length of the first dimension over the area defined by the switches. Since each of the n1 sets of the approximately i1/n1 numbers of second conductors are to be re-aligned from being distributed over a row to be in proximity along the same second dimension, layout tracks along a different interconnection layer is required along a first dimension as described before. The total tracks required along the second dimension is thus (m+i1) and the tracks required in the first dimension is i1/2 over an area defined by (n1×y) number of switches if one layer of interconnections is available, i1/4 tracks per layer if two layers are available, and more reductions if additional layers are available. This is also true for the additional reduced number of tracks required per layer if more layers of interconnections are available along the second dimension.

The second part of FIG. 3 shows n1 sets of non-overlapping second conductors 15, ..., 16, each one having approximately i1/n1 number of second conductors connecting to a respective set of switches 111, ..., 141 having (i1/n1×k) number of switches each. Each of the n1 sets of switches 111, ..., 141 is connected to a respective set of conductors having k number of third set of conductors. For example, those n1 sets of third set of conductors are 151, ..., 152 in FIG. 3. To improve layout, the pitch of the switches 111, ..., 141 of FIG. 3 may be kept along the first dimension to match those of switches 13, ..., 14. Thus there are k rows of switches with each row having the same pitch as 401 along the first dimension next to the rows and columns of switches of FIG. 5 with a total of (133 k) number of switches or similar circuit implementations. The height in each of k rows may be different from that of the basic layout unit 40 of FIG. 5, depending on the switch implementation and the number of switches with a fixed first dimension pitch. So each of the n1 sets of switches 111, ..., 141 are located column-wise along the second dimension with respect to the layout in FIG. 5. In this case, each of the approximately i1/n1 number of second conductors 15, ..., 16 are in proximity connecting to the respective n1 sets of switches 111, ..., 141 (with each set having i1/n1 number of switches organized per row-wise times k columns) with each of the n1 sets of third conductors 161, ..., 163 having k number of third conductors in proximity. Each set of the k number of third conductors 161, ..., 163 are to be distributed over respective rows to connect to one pin in each of the k ports 102, 103, ..., 107, 108 of the functional blocks FB(i), i=[1:k] 132, 133, ..., 137, 138 of FIG. 3.

Again, with the functional blocks 132, 133, ..., 137, 138 of FIG. 3 to be pitch matched to row 401 of FIG. 5, the layout of the third conductors becomes the inverse problem of the illustration of layout connections between the first set of conductors 11, ... 12 connecting to the second set of conductors 15, ..., 16 through the n1 sets of switches 13, ..., 14 of FIG. 3, as discussed with respect to FIG. 5 above. Instead of re-aligning n1 sets of i1/n1 number of distributed second conductors along the second dimension over n1 number of rows along the first dimension to n1 sets of i1/n1 number of second conductors in proximity along the second dimension, the n1 sets of third conductors, each having k number of conductors in proximity along the second dimension, are to be distributed along the second dimension over the respective k number of rows. Thus (i1+k×n1) tracks are required along the second dimension for one layer of interconnections and (k×n1)/2 tracks along the first dimension if one layer of interconnections is available, and (k×n1)/4 tracks per layer if two layers of interconnections are available.

The discussion above with respect to FIGS. 3-6 may be applied to multiple stages of switching networks. For instance, each of the re-aligned or re-grouped i1 conductors groups 601-603, 604-606 through 607-609 is treated as the first conductors (having a total of i1 conductors organized in n1 sets of approximately i1/n1 number of conductors in proximity) to generate the next stage of second conductors with a divider n2(n1×n2 sets of approximately i2/n1/n2 number of non-overlapping conductors) thus only i2/n1/n2 number of conductors in each row of the next stage of second conductors need to be re-aligned or re-grouped n1 times over each row. In this case, the number of tracks required for re-alignment along the first dimension using one layer of interconnections is (i2/n1/n2×n2)/2=(i2/n1)/2 and is (i2/n1)/4 tracks per layer for two layers. This process can continue till the terminating stage where the last ij conductors connecting to the (k×n 1×...×nj) or (k×n) number of pins of the k ports of k number of functional blocks, each one having up to (n1×...×nj) or n number of pins in each port.

Figure 7:
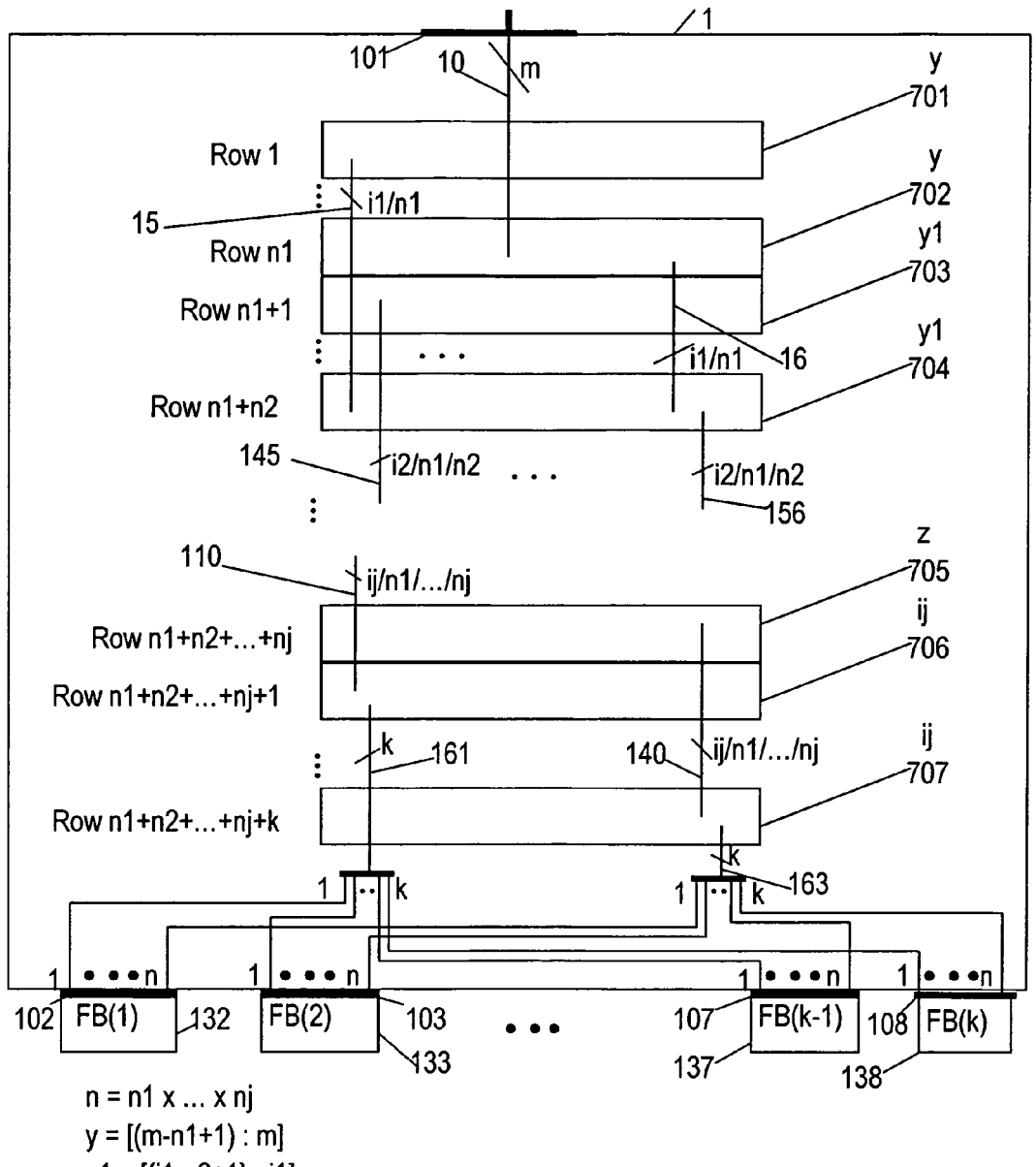
FIG. 7 illustrates one embodiment of j-SN layout organization of FIG. 1 with multiple set of conductors.

Thus for the general interconnection specifications of the j-SN in the embodiments of FIG. 1, the embodiments of FIG. 7 illustrate a layout embodiment where the m conductors or the first conductors 10 run along the second dimension over the n1 number of rows 701-702 where each row has y number of switches or equivalents for y ranging between (m−n1+1) to m, various i1 conductors 15, ..., 16 originating at rows 701-702 and continue over n2 number of rows 703-704, where each of the n2 number of rows has y1 number of switches or equivalents for y1 ranging between (i1−n2+1) to i1, i2 conductors 145, ..., 156 originating from rows 703-704 and continue over another n3 number of rows etc. Each of the n3 number of rows has between (i2−n3+1) and i2 number of switches or equivalents, etc., and the ij conductors 110, ..., 140 originating (nj−1) rows before row 705 and continue over k rows 706-707, where row 705 has $z=[(i_{j-1}-nj+1): i_{j-1}]$ number of switches or equivalents and each of the rows 706-707 has ij number of switches or equivalents. The (n=n1×n 2×...×nj) sets of k number of (k×n) conductors 161, ..., 163 connects to the pins of the k ports 102, 103, ..., 107, 108 of the functional blocks 132, 133, ..., 137, 138. The number of tracks along the second dimension across the rows to lay out the various conductors can hence be calculated based on the number of layers of interconnections available by summing up the number of conductors which are parallel over a number of common rows divided by the number of layers available. The number of tracks along the first dimension along the rows is a function, as discussed in the many embodiments above, of adding up the number of overlapping iq conductors (for q=[1:j]) and (k×n) conductors over one or more rows along the second dimension and divided by a factor, which is two times the number of interconnection layers available for one or two layers. Note that additional reductions can be achieved with more layers available.

In FIG. 7, the maximum number of tracks along the second dimension over the respective ni or k number of rows is determined by the two sets of conductors, this maxima point only occurs at the last row and even in the last row, the number may be less than the maximum. For example, for n1 number of rows 701-702, the last row 702 would have (m+i1−i1/n1) tracks along the second dimension if conductors 16 and 10 do not have overlaps along the second dimension. In row 701, only (m+i1/n1) tracks are used. Thus, it is possible to have some conductors intruding into row areas, where there are available tracks along the second dimension, and making use of the row areas for re-alignment if excess tracks along the first dimension are available.

Applying the technique as illustrated in FIG. 7 to a 2-stage switching network (2-SN) example, the following values are used: m=256, i1=i2=256, n1 =4, n2=8, and k=12, where n1 =4 sets of overlapping m conductors are completely overlapping to illustrate a layout configuration requirement where the 2-SN circuit layout implementation can be about one hundred percent efficient with three layers of interconnections. In the above 2-SN example using, row 704 is row 705, and hence, conductors 145 becomes conductors 110 and conductors 156 is conductors 140. In this example, both the (m+i1)=512 number of conductors of 10, 15, . . . , 16 over rows 701-702 and the (i1+i2)=512 number of conductors of 15, . . . , 16 and 145, . . . , 156 over rows 703-704 along the second dimension are about the same, which is less than the (i2+k×n)=640 number of conductors 110, . . . , 140 plus the conductors 161, . . . , 163. Each row of rows 701-707 has m=i1=i2=256 switches or equivalents in the above 2-SN example. There are (256×Tv) tracks over each row since six hundred and forty conductors is the largest number to cross over the area along the second dimension, Tv=2 would not be sufficient while Tv=3 is more than adequate to handle the layout requirements for conductors over the second dimension. In the above 2-SN example, there are i1/2=128 tracks required over the n1 number of rows 701-702 to re-align i1 conductors along the first dimension using one layer of interconnections or sixty four tracks per layer using two layers, thus the height of the rows 701-702 has to be close to the track requirements. Similarly, over the rows 703-704, there are n1 sets of non-overlapping (i2/n1) number of conductors to be re-aligned, requiring (i2/n1)/2 tracks along the first dimension with one layer of interconnections and half as much tracks if two layers are used. Similarly, in a converse case, over the rows 706-707, there are n=(n1×n2) sets of non-overlapping k number of conductors to be re-distributed to k ports having n pins, thus requiring (k×n)/2 tracks along the first dimension with one layer of interconnections and half as many tracks if two layers are used.

It is readily observed, for one skilled in the art, that the maximum number of re-alignment occurs at the i1 conductors and (k×n) conductors case while the rest of intermediate conductors has lesser track requirements due to the ni dividers. It is thus possible to borrow tracks from nearby rows. For example, the tracks used for i1 re-alignment over rows 701-702 along the first dimension can expand into and beyond rows 703-704, provided additional tracks along the second dimension can be used to allow the excess intrusion of i1 conductors along the second dimension. Similarly, the (k×n) conductors can intrude back up into prior rows if extra tracks are available for layout arrangements.

The layout mechanisms described above are not limited to the implementation of the j-SN described in Pani. Any layout implementation can be optimized using the above described mechanisms where n sets of conductors having i number of conductors in each set and the conductors of each set are running along a second dimension and are distributed over a first dimension that need to be re-aligned in proximity along the second dimension. This is also true for the converse case where sets of conductors which are in proximity are to be distributed instead.

Thus, various embodiments of a scheme in physically implementing the layout of interconnection fabric of a switching network have been described. Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of medial machine-readable medium suitable for storing electronic instructions.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. A circuit layout in an integrated circuit, the circuit layout comprising:
   n1 rows of switches, each row of the n1 rows of switches organized along a second dimension, wherein the switches of each row are organized along a first dimension;
   a first set of conductors comprising i1 conductors organized in proximity along a plurality of tracks in the second dimension distributed over the n1 rows, wherein y number of the first set of conductors are connected to a corresponding y number of the switches in each of the n1 rows for y ranging between (i1−n1+1) to i1; and
   a second set of conductors comprising i2 conductors organized in n1 sets of non-overlapping conductors, each of the n1 sets of non-overlapping conductors having approximately (i2/n1) number of the second set of conductors along the plurality of tracks in the second dimension distributed over a respective row of the n1 rows, wherein the approximately (i2/n1) number of the second set of conductors are connected to the y number of the switches of the respective row.

2. The circuit layout of claim 1, further comprising (i1+i2) tracks in proximity along the second dimension, wherein the first and the second sets of conductors are laid out over the n1 rows along the (i1+i2) tracks.

3. The circuit layout of claim 1, further comprising at most (i2/2) tracks of interconnections in proximity along the first dimension, wherein each set of the n1 sets of the approximately (i2/n1) number of the second set of conductors are re-aligned in proximity along the plurality of tracks in the second dimension over the n1 rows through the at most (i2/2) tracks.

4. The circuit layout of claim 3, further comprising (i1+i2) tracks in proximity along the second dimension, wherein the first and the second sets of conductors are laid out over the n1 rows along the (i1+i2) tracks.

5. A method of laying out an integrated circuit, comprising:
   providing n1 rows of switches in the circuit layout, each of the n1 rows of switches organized along a second dimension, wherein switches of each row of the n1 rows of switches are organized along a first dimension;
   organizing a first set of conductors, comprising i1 conductors, in proximity along a plurality of tracks in the second dimension distributed over the n1 rows of switches, wherein y number of the first set of conductors are connected to a corresponding y number of the switches in each of the n1 rows for y ranging between (i1−n1+1) to i1; and
   organizing a second set of conductors, comprising i2 conductors, in n1 sets of non-overlapping conductors, each of the n1 sets of non-overlapping conductors having approximately (i2/n1) number of the second set of conductors along the plurality of tracks in the second dimension distributed over a respective row of the n1 rows of switches, wherein the approximately (i2/n1) number of the second set of conductors are connected to the y number of the switches of the respective row.

6. The method as set forth in claim 5, further comprising:
providing (i1+i2) tracks in proximity along the second dimension; and
distributing the first and the second sets of conductors over the n1 rows of switches along the (i1+i2) tracks.

7. The method as set forth in claim 5, further comprising:
providing at most (i2/2) tracks of interconnections in proximity along the first dimension; and
re-aligning each set of the n1 sets of the approximately (i2/n1) number of second set of conductors in proximity along the plurality of tracks in the second dimension over the n1 rows of switches through the at most (i2/2) tracks.

8. The method as set forth in claim 7, further comprising:
providing (i1+i2) tracks in proximity along the second dimension; and
distributing the first and the second sets of conductors over the n1 rows of switches along the (i1+i2) tracks.

9. An integrated circuit layout, comprising:
a first set of conductors comprising i1 number of conductors organized in n1 sets of non-overlapping second set of conductors, each of the n1 sets of the second set of conductors having approximately (i1/n1) number of the first set of conductors, wherein each of the n1 sets of the second set of conductors are laid out in at least i1 number of tracks in proximity along a second dimension; and
at most (i1/2) tracks along a first dimension, wherein each of the n1 sets of the second set of conductors are re-aligned in proximity along the second dimension through the at most (i1/2) tracks along the first dimension.

10. A method of laying out an integrated circuit, comprising:
organizing a first set of conductors, comprising i1 number of conductors, in n1 sets of non-overlapping second set of conductors, each of the n1 sets of the second set of conductors having approximately (i1/n1) number of the first set of conductors;
distributing in proximity each of the second set of conductors in at least i1 number of tracks along a second dimension of a circuit layout;
providing at most (i1/2) tracks along a first dimension of the integrated circuit; and
re-aligning in proximity each of the n1 sets of the second set of conductors along the second dimension in the circuit layout through the at most (i1/2) tracks along the first dimension.

11. An article of manufacture comprising a machine readable medium that stores data representing an integrated circuit layout, comprising:

n1 rows of switches, each row of the n1 rows of switches organized along a second dimension, wherein the switches of each row are organized along a first dimension;
a first set of conductors comprising i1 conductors organized in proximity along a plurality of tracks in the second dimension distributed over the n1 rows, wherein y number of the first set of conductors are connected to a corresponding y number of the switches in each of the n1 rows for y ranging between (i1−n1+1) to i1; and
a second set of conductors comprising i2 conductors organized in n1 sets of non-overlapping conductors, each of the n1 sets of non-overlapping conductors having approximately (i2/n1) number of the second set of conductors along the plurality of tracks in the second dimension distributed over a respective row of the n1 rows, wherein the approximately (i2/n1) number of the second set of conductors are connected to the y number of the switches of the respective row.

12. The article of manufacture of claim 11, wherein the data representing the integrated circuit layout further comprises (i1+i2) tracks in proximity along the second dimension, wherein the first and the second sets of conductors are laid out over the n1 rows along the (i1+i2) tracks.

13. The article of manufacture of claim 11, wherein the data representing the integrated circuit layout further comprises at most (i2/2) tracks of interconnections in proximity along the first dimension, wherein each set of the n1 sets of the approximately (i2/n1) number of the second set of conductors are re-aligned in proximity along the plurality of tracks in the second dimension over the n1 rows through the at most (i2/2) tracks.

14. The article of manufacture of claim 11, wherein the data representing the integrated circuit layout further comprises (i1+i2) tracks in proximity along the second dimension, wherein the first and the second sets of conductors are laid out over the n1 rows along the (i1+i2) tracks.

15. An article of manufacture comprising a machine readable medium that stores data representing an integrated circuit layout, comprising:
a first set of conductors comprising i1 number of conductors organized in n1 sets of non-overlapping conductors, each of the n1 sets of non-overlapping conductors having approximately (i1/n1) number of the first set of conductors, wherein each of the approximately (i1/n1) number of the first set of conductors are laid out in at least i1 number of tracks in proximity along a second dimension; and
at most (i1/2) tracks along a first dimension, wherein each of the n1 sets of the first set of conductors are re-aligned in proximity along the second dimension through the at most (i1/2) tracks along the first dimension, each of the n1 sets of the first set of conductors having approximately (i1/n1) number of the second set of conductors.

* * * * *